United States Patent [19]

Pricer

[11] Patent Number: 4,701,642
[45] Date of Patent: Oct. 20, 1987

[54] BICMOS BINARY LOGIC CIRCUITS

[75] Inventor: Wilbur D. Pricer, Burlington, Vt.

[73] Assignee: International Business Machines Corporation, Armonk, N.Y.

[21] Appl. No.: 856,889

[22] Filed: Apr. 28, 1986

[51] Int. Cl.$^4$ ............................................ H03K 17/04
[52] U.S. Cl. .................................. 307/446; 307/451; 307/454; 307/570; 307/246
[58] Field of Search ............... 307/446, 448, 451, 454, 307/570, 585, 246

[56] References Cited

U.S. PATENT DOCUMENTS

| | | | |
|---|---|---|---|
| 3,217,181 | 11/1965 | Zuk ..................................... | 307/446 |
| 3,541,353 | 11/1970 | Seelbach et al. .................... | 307/446 |
| 3,636,372 | 1/1972 | Hujita et al. ......................... | 307/251 |
| 4,069,428 | 1/1978 | Reedy ............................. | 307/446 X |
| 4,159,450 | 6/1979 | Hoover ........................... | 330/300 X |
| 4,301,383 | 11/1981 | Taylor ................................ | 307/585 |
| 4,425,516 | 1/1984 | Wanlass .............................. | 307/446 |
| 4,558,234 | 12/1985 | Suzuki et al. ........................ | 307/446 |

FOREIGN PATENT DOCUMENTS

| | | | |
|---|---|---|---|
| 0099100 | 1/1984 | European Pat. Off. ............ | 307/570 |
| 225286 | 7/1985 | Fed. Rep. of Germany ...... | 307/570 |
| 45207 | 3/1980 | Japan ................................. | 307/446 |
| 19435 | 1/1984 | Japan ................................. | 307/446 |
| 196625 | 11/1984 | Japan ................................. | 307/446 |
| 21626 | 2/1985 | Japan ................................. | 307/570 |
| 141018 | 7/1985 | Japan ................................. | 307/446 |

OTHER PUBLICATIONS

"Merged Bipolar-CMOS Device"; IBM-TDB; vol. 28, No. 8, pp. 3558-3561; 1/1986.
IBM Technical Disclosure Bulletin, vol. 16, No. 11, Apr. 1974, pp. 3570-3571, "Push-Pull Device Using Bipolar and Complementary Metal-Oxide Semiconductor Devices," by W. B. Chin.
IBM Technical Disclosure Bulletin, vol. 27, No. 4A, Sep. 1984, pp. 1974-1975, "Combination CMOS/Bipolar Driver for High Capacitance", by W. D. Pricer.
Electronics Week, Nov. 5, 1984, pp. 17 and 18, "Cells Combine CMOS, Bipolar Transistors", by C. L. Cohen.

Primary Examiner—Stanley D. Miller
Assistant Examiner—D. R. Hudspeth
Attorney, Agent, or Firm—Stephen J. Limanek

[57] ABSTRACT

A BICMOS binary logic circuit or system is provided which includes P-channel and N-channel transistors, a bipolar transistor having a base connected to the drain of the P-channel transistor, a diode, preferably a Schottky barrier diode, connected between the emitter of the bipolar transistors and the drain of the N-channel transistor, a capacitor load connected to the emitter of the bipolar transistor and an input terminal connected to control electrodes of the P-channel and N-channel transistors.

16 Claims, 4 Drawing Figures

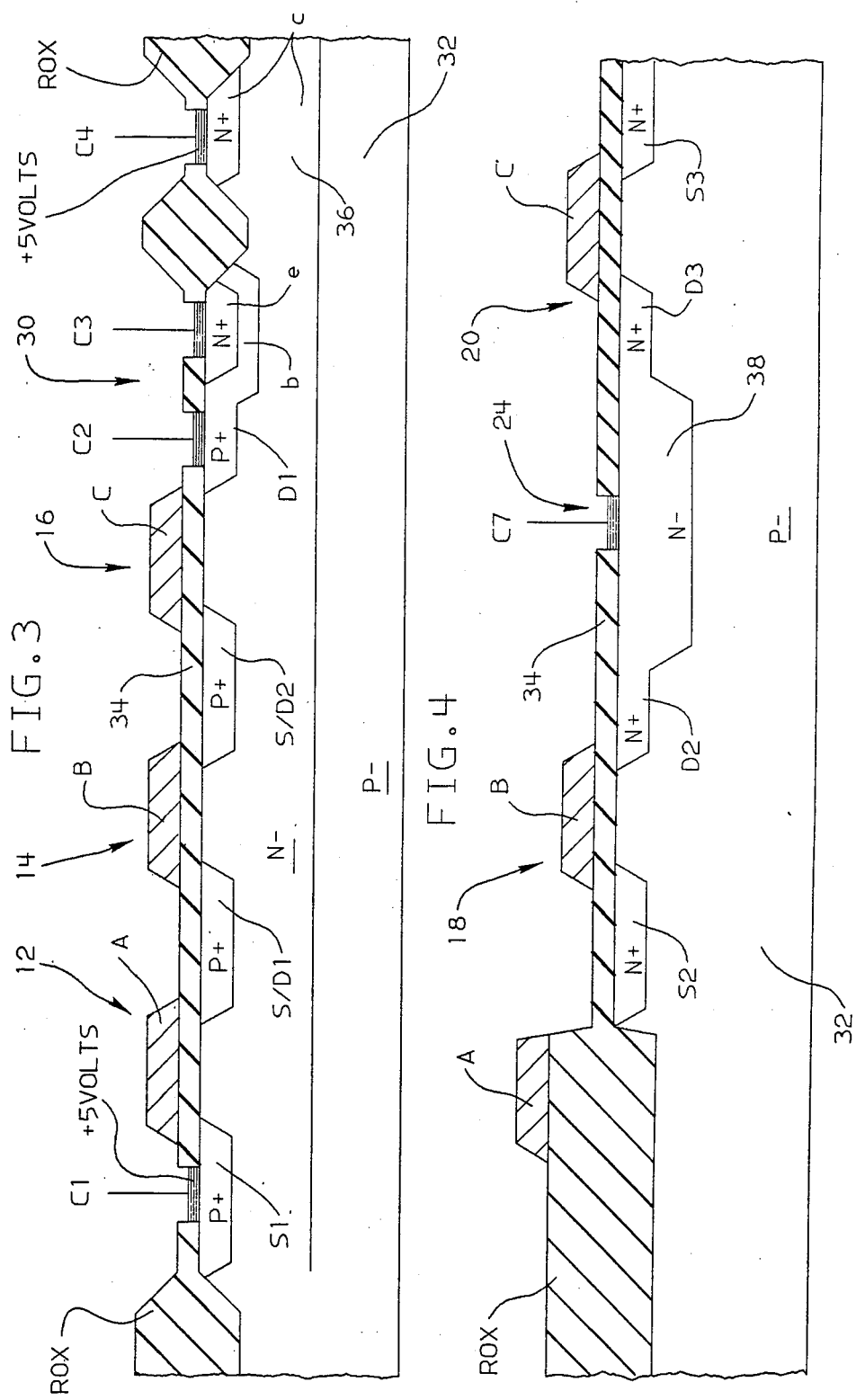

BICMOS BINARY LOGIC CIRCUITS

DESCRIPTION

1. Technical Field

This invention relates to high performance integrated semiconductor circuits and, more particularly, to binary logic circuits which use a combination of complementary metal oxide semiconductor (CMOS) transistors and a bipolar transistor for a new family of high performance CMOS logic.

2. Background Art

CMOS logic circuits are dense and consume very small amounts of power but generally have lower performance than do bipolar logic circuits. Much of the performance difference between the CMOS logic circuits and the bipolar logic circuits is due to the limited on-chip capacitance drive capability of the CMOS circuits. In a CMOS circuit which acts as a logic gate, P-channel transistors are normally arranged in parallel and N-channel transistors are connected in series to more nearly equalize the delay through these different devices since the P-channel transistors are significantly slower than the N-channel transistors. P-channel transistors have about 40% of the transconductance of N-channel transistors of the same size. In the CMOS technology, when the load capacitance is high the logic gate is often provided with an additional stage in the form of a power inverter to enhance drive capability.

BiCMOS circuits, i.e., circuits which use both CMOS and bipolar transistors, are well known, as, e.g., disclosed in U.S. Pat. No. 3,636,372, filed on Dec. 6, 1968, wherein a switching circuit has a bipolar transistor connected as an emitter follower to the output of a CMOS inverter.

In U.S. Pat. No. 4,159,450, filed May 22, 1978, there is disclosed a pair of complementary field effect transistors in a push-pull driver stage having a pair of complementary bipolar transistors connected to an output terminal. Also, U.S. Pat. Nos. 4,301,383, filed Oct. 5, 1979, and 4,425,516, filed May 1, 1981, describe buffer circuits having complementary field effect transistors with outputs in a bipolar emitter follower circuit configuration.

Other driver circuits which feed high capacitance loads having both CMOS and bipolar transistors are illustrated and described in IBM Technical Disclosure Bulletin, Vol. 16 No. 11 April 1974, pp 3570 and 3571, "PUSH-PULL DRIVER USING BIPOLAR AND COMPLEMENTARY METAL-OXIDE SEMICONDUCTOR DEVICES" by W. B. Chin and Vol. 27 No. 4A September 1984, pp 1974 and 1975 "COMBINATION CMOS/BIPOLAR DRIVER FOR HIGH CAPACITANCE" by W. D. Pricer.

DISCLOSURE OF THE INVENTION

It is an object of this invention to provide an improved high peformance logic family of dense, low power CMOS circuits which may be used to feed into high capacitance loads without using one or more additional power inverter stages. It is a further object of this invention to increase the speed and current drive of CMOS logic circuits without substantially increasing their size or complexity.

In accordance with the teachings of this invention, a binary logic circuit is provided which includes a bipolar transistor having a collector connected to a source of positive potential, a P-channel transistor connected between the base of the bipolar transistor and the source of positive potential and an N-channel transistor coupled between the emitter of the bipolar transistor and ground with a diode connected between the emitter and the N-channel transistor. A load capacitor is connected to the emitter of the bipolar transistor and an input terminal is connected to the control gates of the P-channel and N-channel transistors. In a more specific embodiment of the invention, the logic circuit includes a NOR circuit having a plurality of parallelly-arranged N-channel devices and a series circuit having a plurality of P-channel devices coupled at one end thereof to the N-channel devices, a bipolar transistor having a base connected to the one end the series circuit, a diode coupled between the emitter of the transistor and the drains of the N-channel devices and an output terminal coupled to the emitter of the transistor.

The foregoing and other objects, features and advantages of the invention will be apparent from the following more particular description of the preferred embodiments of the invention, as illustrated in the accompanying drawings.

BRIEF DESCRIPTION OF THE DRAWINGS

FIG. 3 is a sectional view of the circuit of FIG. 1 taken through line 3—3 of FIG. 2, and FIG. 4 is a sectional view of the circuit of FIG. 1 taken through line 4—4 of FIG. 2.

BEST MODE FOR CARRYING OUT THE INVENTION

Figure 1:
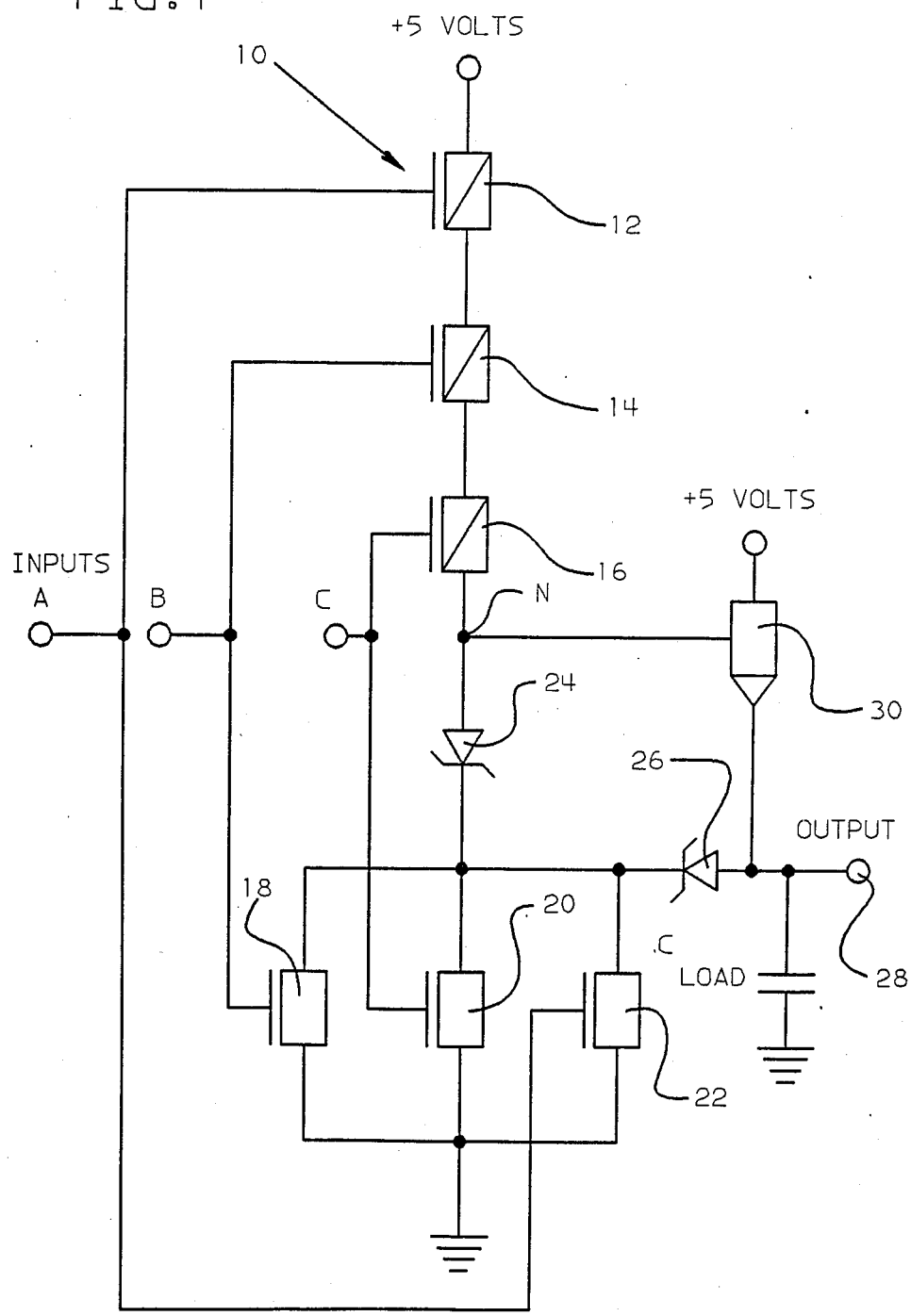
FIG. 1 is a circuit diagram of one embodiment of the logic circuit of the present invention.

Referring to the drawings in more detail, there is illustrated in FIG. 1 one embodiment of the logic circuit of the present invention which includes a NOR circuit 10 having a plurality of serially-arranged P-channel field effect transistors 12, 14 and 16 and a plurality of parallelly-arranged N-channel transistors 18, 20 and 22 with their sources connected to ground. An input A is connected to the control electrode or gate of the P-channel transistor 12 and to the control electrode or gate of the N-channel transistor 22, an input B is connected to the control gate of the P-channel transistor 14 and to the control gate of N-channel transistor 18 and an input C is connected to the control gates of P-channel transistor 16 and N-channel transistor 20. The source of the P-channel transistor 12 is connected to a source of potential of +5 volts. A first diode 24, preferably a Schottky diode, is connected between the drain of P-channel transistor 16 and the drains of the N-channel transistors 18, 20 and 22. A second diode 26, preferably another Schottky diode, is connected between the drains of the N-channel transistors 18, 20 and 22 and an output terminal 28. An NPN-type bipolar transistor 30 has its collector connected to the +5 volt source of potential and its emitter connected to the output terminal 28 with its base connected to the drain of the P-channel transistor 16. A capacitive load $C_{LOAD}$ is connected between the output terminal 28 and ground.

Figure 2:
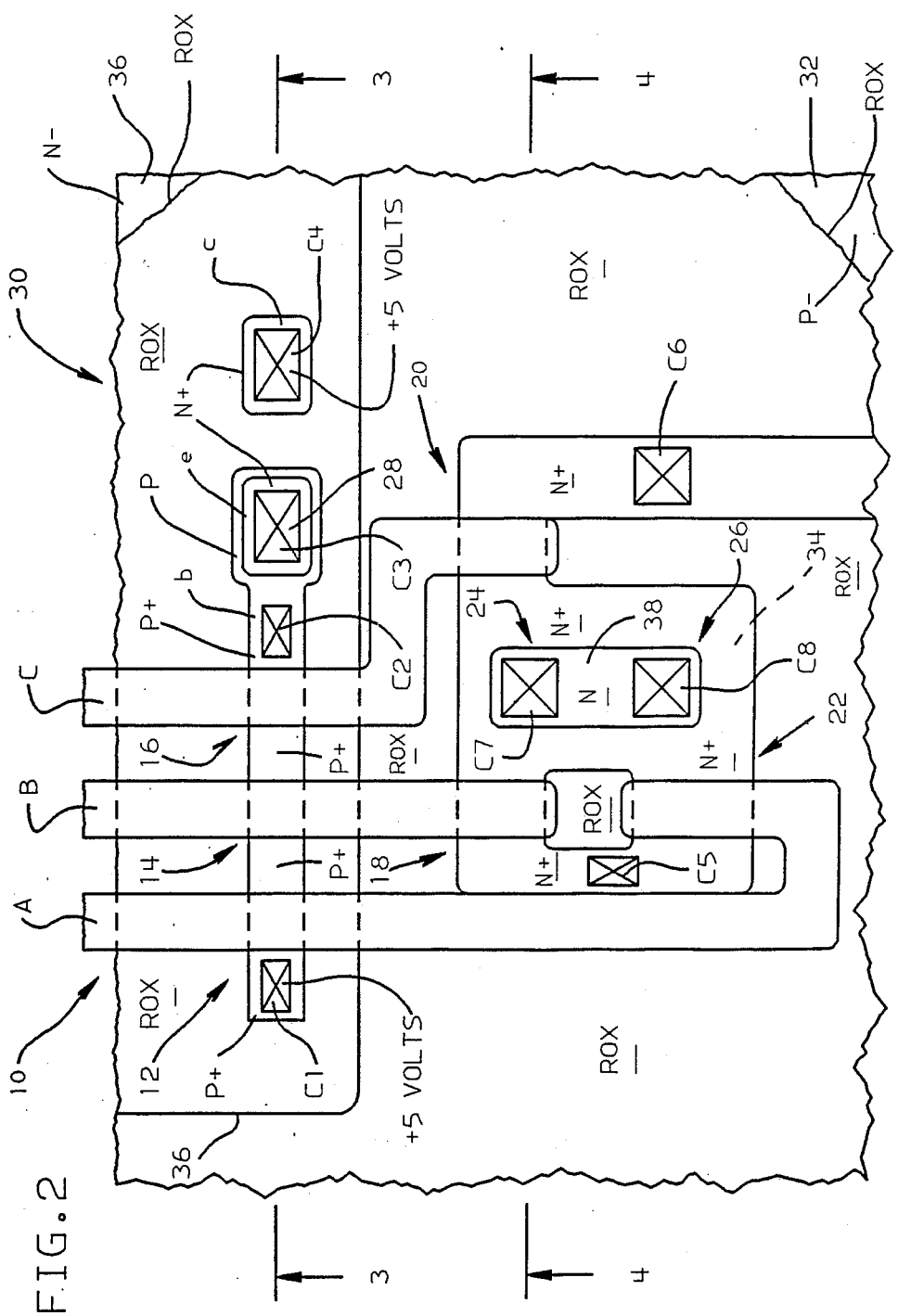
FIG. 2 is a layout of the circuit illustrated in FIG. 1 in a semiconductor substrate.

FIG. 2 of the drawings is a layout of the logic circuit illustrated in FIG. 1 in a semiconductor substrate 32, preferably silicon of a P— type conductivity, on which is disposed an insulating layer 34, preferably made of silicon dioxide. A well 36 having an N— type conductivity is formed in the substrate 32 by any known processing techniques. The series of P-channel transistors 12, 14 and 16 is shown disposed within the well 36 between contacts C1 and C2, with contact C1 also indicated as being connected to the +5 volt source of potential and contact C2 indicated as being connected to the base b of bipolar transistor 30, which likewise is located within the N well 36. Contact C3 is connected to the emitter e of transistor 30 and contact C4 is connected to the collector c of the transistor 30, with contact C4 also being connected to the +5 volt source of potential.

The parallelly-arranged N-channel transistors 18, 20 and 22 are disposed in the P— type silicon substrate 32 with a field region in the form of a recessed oxide ROX interposed between the transistors 12, 14, 16 and 30 in the N well 36 and the N-channel transistors 18, 20 and 22. The drains of the transistors 18, 20 and 22 are connected in common at an N— region 38 and the sources of the transistors 18 and 22 are connected to a common contact C5 with the source of transistor 20 being connected to contact C6, contacts C5 and C6 being connected to ground (not shown). The control gates of the transistors 18 and 22 connected to inputs B and A, respectively, are separated by a region of the recessed oxide ROX. As can be seen in FIG. 2, the control gates of the P-channel transistor 12 and the N-channel transistor 22 are part of a common conductive line connected to input A, the control gates of the P-channel transistor 14 and the N-channel transistor 18 are part of a common conductive line connected to input B and the control gates of the P-channel transistor 16 and the N-channel transistor 20 are part of a common conductive line connected to input C. The common conductive lines connected to inputs A, B and C are made preferably of doped polysilicon. The N— region 38 has contacts C7 and C8, which may be made of any appropriate metal, such as aluminum, disposed thereon to form the Schottky diodes 24 and 26, respectively. To complete the logic circuit of FIG. 1 in the layout of FIG. 2, contact C2 at the base b of the bipolar transistor 30 is wired to the contact C7 at the anode of the first diode 24, contact C3 at the emitter e of the transistor 30 is wired to the contact C8 at the anode of the second diode 26 and contact C5 at the sources of the N-channel transistors 18 and 22 is wired to the contact C6 at the source of the N-channel transistor 20. These contacts may be conveniently wired by depositing a layer of conductive metal, e.g., aluminum, not shown, and using well known masking and etching techniques.

FIG. 3 of the drawings is a sectional view of the layout illustrated in FIG. 2 taken through line 3—3 thereof which shows the P-channel transistors 12, 14 and 16 along with the bipolar transistor 30 in the N well 36. As can be seen in FIG. 3, transistor 12 includes the input or control electrode A separated from the surface of the N well 36 by the silicon dioxide layer 34, P+ source S1 and P+ drain S/D1, transistor 14 includes the input or control electrode B, P+ source S/D1 and P+ drain S/D2 and transistor 16 includes the input or control electrode C, P+ source S/D2 and P+ drain D1. The bipolar transistor 30 includes the N+/N—collector c, the P+/P base b and the N+ emitter e.

· FIG. 4 of the drawings is a sectional view of the layout illustrated in FIG. 2 taken through line 4—4 thereof which shows the N-channel transistors 18 and 20 along with the first Schottky diode 24 formed in the P— silicon substrate 32. As can be seen in FIG. 4, transistor 18 includes the input or control electrode B separated from the surface of the P— silicon substrate 32 by the silicon dioxide layer 34, N+ source S2 and N+ drain D2 and transistor 20 includes the input or control electrode C, N+ source S3 and N+ drain D3. The first Schottky diode 24 includes the contact C7 as its anode and the N— region 38 as its cathode.

It can be readily seen from FIGS. 2, 3 and 4 that the logic circuit of FIG. 1 may be integrated into a very compact structure to provide a high density of these logic circuits in a semiconductor substrate.

In the operation of the logic circuit of this invention, when a binary 1 or high voltage, e.g., +5 volts, is applied to each of the inputs A, B and C transistors 18, 20, and 22 are rendered conductive. Diode 26 is conductive until output 28 is discharged to within one diode drop of ground. When a binary 0 or low voltage, e.g., zero volts, is applied to each of the inputs A, B and C transistors 12, 14, and 16 are rendered conductive and transistor 30 is conductive until output 28 is charged to nearly +5 volts.

It can be seen that the high series resistance of the P-channel transistors coupled to relatively low capacitive node N is decoupled from the high load capacitor $C_{LOAD}$ by the current gain of the bipolar transistor 30.

Although one embodiment of the present invention has been illustrated and described hereinabove, it should be understood that many other logic circuits may be made which fall within the scope of this invention. For example, the logic circuit may include only two inputs A and B, wherein the P-channel transistor 16 and the N-channel transistor 20 would be eliminated from the logic circuit. Furthermore, if desired, the first and second Schottky diodes 24 and 26 may be replaced by any ordinary or regular P-N junction diodes, although Schottky diodes are prefered since they have a low capacitance and low forward conduction voltage. Also, if desired, the first diode 24 may be removed from the logic circuit so that the drain of the P-channel transistor 16 is directly connected to the drains of the N-channel transistors 18, 20 and 22. The elimination of the first diode 24 decreases the speed of the circuit slightly since the presence of this diode 24 minimizes the voltage swing at the base of the NPN transistor 30 and provides less power consumption.

It should also be understood that the second diode 26 plays an important roll in the operation of the logic circuit of FIG. 1 in that it allows the N-channel transistors to drive the output 28 directly and isolates the base of the NPN transistor 30 from the load capacitor for faster operation during charge up.

It should also be noted that the output load $C_{LOAD}$ can be rapidly charged and discharged with the logic circuit including only a CMOS inverter, such as transistors 16 and 20, bipolar transistor 30 and second diode 26, wherein the P-channel transistor 16 turns on to charge the load capacitor through the bipolar transistor 30 and the N-channel transistor 20 turns on to discharge the load capacitor through the second diode 26 and the N-channel transistor 20.

It can be seen that logic circuits, which are a family of circuits, have been described in accordance with the teachings of this invention that can be formed in a semiconductor substrate as dense, low power, high performance CMOS circuits which may be used to feed into high capacitance loads without using an additional power inverter stage.

While the invention has been particularly shown and described with reference to preferred embodiments thereof, it will be understood by those skilled in the art that various changes in form and details may be made therein without departing from the spirit and scope of the invention.

What is claimed is:

1. A binary logic circuit comprising
   a NOR circuit having first and second N-channel transistor devices connected in parallel and first and second P-channel transistor devices connected in series and coupled between said N-channel devices and a source of potential,
   a bipolar transistor having a base connected to the drain of said first P-channel device and coupled to said source of potential,
   a capacitor having charge selectively stored therein and coupled to an emitter of said bipolar transistor,
   means including a diode connected in series with at least one of said first and second N-channel devices for discharging substantially all charge on said capacitor through said diode and said at least one of said first and second N-channel devices to a point of reference potential,
   means for applying input signals to control electrodes of said devices, and
   an output terminal connected to the emitter of said transistor.

2. A binary logic circuit as set forth in claim 1 wherein said diode is a Schottky diode.

3. A binary logic circuit as set forth in claim 1 further including a second diode coupled between the base of said transistor and the drains of said N-channel devices.

4. A binary logic circuit as set forth in claim 3 wherein said second diode is a Schottky diode.

5. A binary logic circuit as set forth in claim 1 wherein said transistor is an NPN transistor having a collector connected to said source of potential.

6. A binary logic circuit as set forth in claim 1 wherein said input signal applying means includes a first input terminal coupled to said first N-channel device and to said first P-channel device and a second input terminal coupled to said second N-channel device and to said second P-channel device.

7. A binary logic circuit comprising
   first and second serially-connected P-channel field effect transistors,
   a first N-channel field effect transistor, the drain of said first P-channel transistor being coupled to the drain of said N-channel transistor, the source of said second P-channel transistor being coupled to a source of positive potential and the source of said N-channel transistor being coupled to ground,
   a bipolar transistor having a base coupled to the drain of said first P-channel transistor and a collector coupled to said source of positive potential,
   a capacitor coupled between the emitter of said bipolar transistor and ground,
   means including a first diode and connected in series with said first N-channel field effect transistor for discharging substantially all charge on said capacitor through said diode and said first N-channel field effect transistor to said ground,
   first and second input terminals, said first input terminal being coupled to the control electrode of said first P-channel transistor and said second input terminal being coupled to the control electrode of said second P-channel transistor, and
   means for applying an input signal through one of said first and second input terminals to a control electrode of said first N-channel field effect transistor.

8. A binary logic circuit as set forth in claim 7 wherein said bipolar transistor is an NPN bipolar transistor.

9. A binary logic circuit as set forth in claim 7 wherein said diode is a Schottky diode.

10. A binary logic circuit as set forth in claim 7 further including a second diode connected between the drains of said first P-channel and N-channel transistors.

11. A binary logic circuit as set forth in claim 10 wherein said first and second diodes are Schottky diodes.

12. A binary logic circuit as set forth in claim 7 further including a second N-channel field effect transistor connected in parallel with said first N-channel transistor, said input signal applying means being connected to said first input terminal and said second input terminal being further coupled to the control electrode of said second N-channel transistor.

13. A binary logic circuit comprising
    first and second P-channel field effect transistors having control electrodes,
    a bipolar transistor having an emitter, a base and a collector connected to a source of positive potential, said first and second transistors being serially-connected between the base of said bipolar transistor and said source of positive potential,
    first and second parallelly-connected N-channel field effect transistors having control electrodes and having sources connected to ground,
    a first Schottky barrier diode, said first diode being connected between the drains of said first P-channel and N-channel transistors
    a load capacitor connected between the emitter of said bipolar transistor and ground,
    means including a second Schottky diode connected in series with at least one of said first and second N-channel field effect transistors for discharging substantially all charge on said load capacitor through said second Schottky diode and said at least one of said first and second N-channel field effect transistors to said ground, and
    first and second input terminals, said first input terminal being connected to the control electrodes of said first P-channel and N-channel transistors and said second input terminal being connected to the control electrodes of said second P-channel and N-channel transistors.

14. A binary logic circuit as set forth in claim 13 further including
    a third P-channel field effect transistor having a control electrode and serially connected with said first and second P-channel transistors between the base of said bipolar transistor and said source of positive potenial,
    a third N-channel field effect transistor having a control electrode and connected in parallel with said first and second N-channel transistors, and
    a third input terminal connected to the control electrodes of said third P-channel and N-channel transistors.

15. A binary logic circuit comprising
    a bipolar transistor having a collector coupled to a source of positive potential,
    a P-channel field effect transistor coupled between the base of said bipolar transistor and said source of positive potential, a capacitor coupled to the emitter of said bipolar transistor,
an N-channel field effect transistor serially coupled with said P-channel field effect transistor and disposed between said P-channel field effect transistor and a point of reference potential,
an input terminal coupled to the control electrodes of said P-channel and N-channel transistors, and means including a series circuit having a diode for discharging substantially all charge on said capacitor through said diode and said N-channel transistor to said point of reference potential.

16. A binary circuit as set forth in claim 15 wherein said bipolar transistor is an NPN transistor, said diode is a Schottky diode and the source of said N-channel transistor is connected to ground.

* * * * *